United States Patent
Um et al.

(10) Patent No.: US 9,664,954 B2
(45) Date of Patent: May 30, 2017

(54) LIQUID CRYSTAL DISPLAY AND MANUFACTURING METHOD THEREOF

(71) Applicant: Samsung Display Co., Ltd., Yongin (KR)

(72) Inventors: Nu Ree Um, Icheon-si (KR); Min Jung Kang, Incheon (KR); Hye Ran Mun, Yangju-si (KR); Sang Hun Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 44 days.

(21) Appl. No.: 14/660,573

(22) Filed: Mar. 17, 2015

(65) Prior Publication Data

US 2016/0062171 A1    Mar. 3, 2016

(30) Foreign Application Priority Data

Aug. 27, 2014  (KR) .......................... 10-2014-0112423

(51) Int. Cl.
| | | |
|---|---|---|
| *G02F 1/1339* | (2006.01) | |
| *G03F 7/00* | (2006.01) | |
| *G02F 1/1335* | (2006.01) | |
| *G03F 7/40* | (2006.01) | |
| *G02F 1/1368* | (2006.01) | |
| *G02F 1/1362* | (2006.01) | |

(52) U.S. Cl.
CPC ........ *G02F 1/13394* (2013.01); *G03F 7/0007* (2013.01); *G03F 7/40* (2013.01); *G02F 1/136209* (2013.01); *G02F 2001/13396* (2013.01); *G02F 2001/13398* (2013.01); *G02F 2001/136222* (2013.01)

(58) Field of Classification Search
None
See application file for complete search history.

(56) References Cited

U.S. PATENT DOCUMENTS

| | | | |
|---|---|---|---|
| 6,466,296 B1* | 10/2002 | Yamada | G02F 1/13334 349/130 |
| 2011/0187631 A1* | 8/2011 | Lee | G09G 3/36 345/87 |
| 2011/0222014 A1* | 9/2011 | Kim | G02F 1/13394 349/155 |
| 2014/0055696 A1 | 2/2014 | Lee et al. | |

FOREIGN PATENT DOCUMENTS

| | | |
|---|---|---|
| JP | 2003-228085 | 8/2003 |
| JP | 2009-229667 | 10/2009 |
| KR | 10-2014-0043198 | 4/2014 |

* cited by examiner

*Primary Examiner* — Ashok Patel
(74) *Attorney, Agent, or Firm* — H.C. Park & Associates, PLC

(57) ABSTRACT

A liquid crystal display including a light blocking member disposed on a substrate; and a first column spacer and a second column spacer disposed at a distance from each other on the light blocking member. The first column spacer includes a support portion and a column portion, and the second column spacer includes only a column portion.

9 Claims, 10 Drawing Sheets

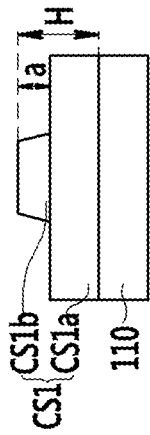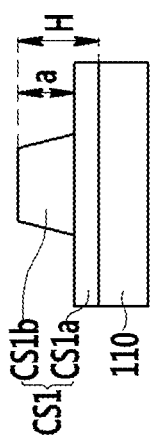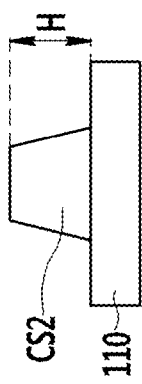

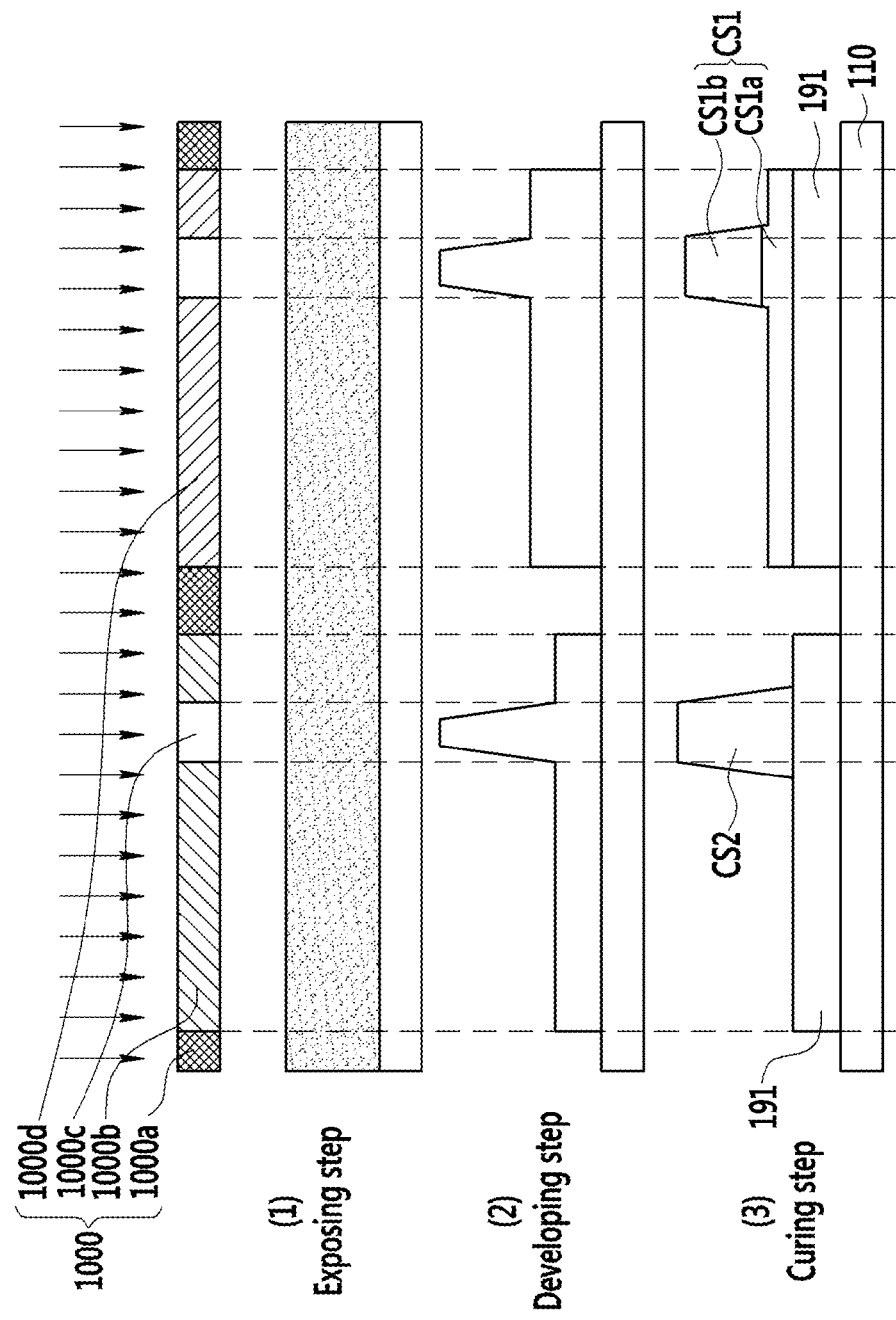

LIQUID CRYSTAL DISPLAY AND MANUFACTURING METHOD THEREOF

CROSS-REFERENCE TO RELATED APPLICATION

This application claims priority from and the benefit of Korean Patent Application No. 10-2014-0112423, filed on Aug. 27, 2014, which is hereby incorporated by reference for all purposes as if fully set forth herein.

BACKGROUND

Field

Exemplary embodiments of the present invention relate to a liquid crystal display and a manufacturing method thereof.

Discussion of the Background

A liquid crystal display (LCD) is one kind of flat panel display which is currently most widely used. An LCD includes two sheets of display panels in which field generating electrodes, such as a pixel electrode and a common electrode, are formed, and a liquid crystal layer interposed therebetween, and displays an image by applying a voltage to the field generating electrodes to generate an electric field in the liquid crystal layer, thereby determining an orientation of liquid crystal molecules of the liquid crystal layer based on the generated electric field and controlling polarization of incident light.

A gap of a liquid crystal layer between the two display panels is called a cell gap, and the cell gap affects all operation characteristics of the liquid crystal display, such as response speed, contrast ratio, viewing angle, luminance uniformity, and the like. If the cell gap is inconsistent, a uniform image cannot be displayed throughout the screen, thereby causing a failure in image quality. Thus, a plurality of spacers are formed at one side of the two panels so as to maintain a uniform cell gap throughout the whole area on the substrate. As the spacer, a column spacer has been commonly used.

In particular, in case of a curved liquid crystal panel, when an impact is applied to the panel from tapping or pressure, a recovery force of the cell gap of column spacers formed on a substrate is reduced, thereby causing a smear phenomenon.

The above information disclosed in this Background section is only for enhancement of understanding of the background of the invention and therefore it may contain information that does not form the prior art that is already known in this country to a person of ordinary skill in the art.

SUMMARY

Exemplary embodiments of the present invention provide a liquid crystal display that can prevent occurrence of a smear phenomenon resulting from an impact applied to a liquid crystal panel, and a method for manufacturing the same.

Additional features of the invention will be set forth in the description which follows, and in part will be apparent from the description, or may be learned by practice of the invention.

An exemplary embodiment of the present invention discloses a liquid crystal display including: a light blocking member formed on a substrate; and a first column spacer and a second column spacer disposed at a predetermined distance from each other on the light blocking member. The first column spacer includes a support portion and a column portion, and the second column spacer includes only a column portion.

An exemplary embodiment of the present invention also discloses a method of manufacturing a liquid crystal display including: forming a light blocking member on a substrate; and forming a first column spacer and a second column spacer on the light blocking member, such that the first column spacer includes a support portion and a column portion and the second column spacer includes only a column portion.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

FIG. 4A, FIG. 4B, and FIG. 4C show compression characteristics according to the different heights of a support portion of a column spacer.

FIG. 9 shows a method for manufacturing a light blocking member and a column spacer of the liquid crystal display according to an exemplary embodiment of the present invention.

DETAILED DESCRIPTION OF THE ILLUSTRATED EMBODIMENTS

Figure 1:
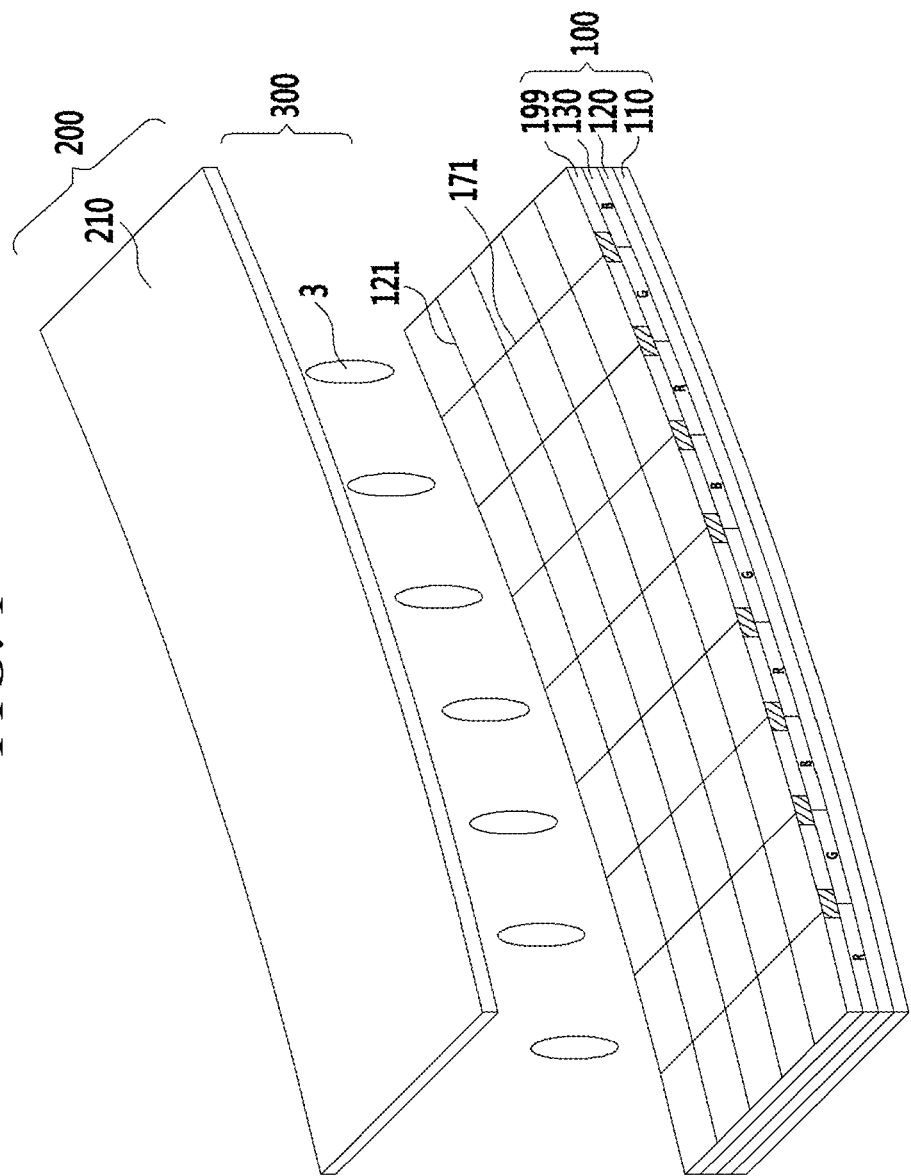
FIG. 1 is a perspective view of a liquid crystal display according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art.

In the drawings, the thickness of layers, films, panels, regions, etc., are exaggerated for clarity. It will be understood that when an element or layer is referred to as being "on" another element, layer, or substrate, it can be directly on the other element, layer or substrate, or intervening elements, layers, or substrates may also be present. In contrast, when an element or layer is referred to as being "directly on" or "directly connected to" another element, layer, or substrate, there are no intervening elements, layers, or substrates present. Like reference numerals designate like elements throughout the specification. It will be understood that for purposes of this disclosure, "at least one of X, Y, and Z" can be construed as X only, Y only, Z only, or any combination of two or more items X, Y, and Z (e.g., XYZ, XYY, YZ, ZZ).

Figure 2:
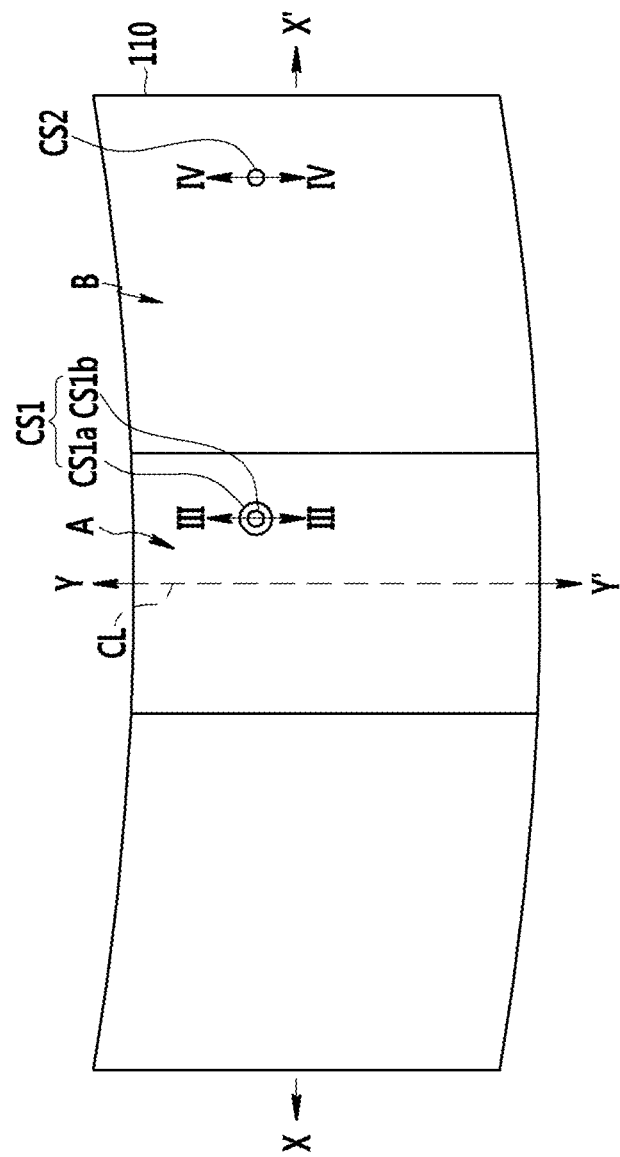
FIG. 2 is provided for showing locations where a first column spacer and a second column spacer are formed.
Figure 3:
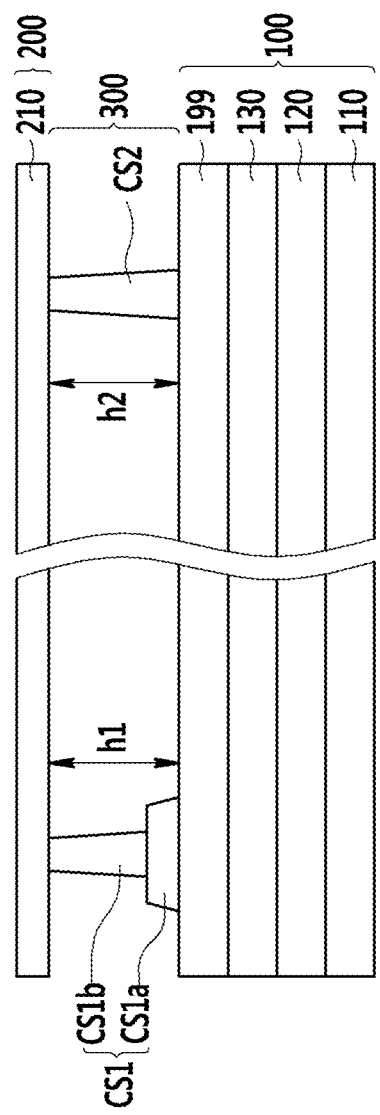
FIG. 3 is a cross-sectional view of FIG. 2, taken along the lines III-III and IV-IV.

Referring to FIG. 1 to FIG. 3, a liquid crystal display according to an exemplary embodiment of the present invention includes a lower display panel 100 and an upper display panel 200 bonded to each other, a liquid crystal layer 300 interposed therebetween for realization of a liquid crystal cell, and column spacers CS1 and CS2 for constant maintenance of cell gaps of the liquid crystal cells.

The lower panel 100 includes a first substrate 110, a membrane structure 120, a plurality of color filters 130, a light blocking member 199, the first column spacer CS1, and the second column spacer CS2.

The membrane structure provided on the first substrate 110 includes a thin film transistor. The thin film transistor is a switching element, and may be formed of three terminals of a control terminal, an input terminal, and an output terminal. This will be described in detail later.

The plurality of color filters 130 are provided on the membrane structure 120. The plurality of color filters 130 include a red color filter R, a green color filter G, and a blue color filter B that are arranged at a predetermined distance from each other. The plurality of color filters 130 are formed in parallel with each other along a horizontal direction, but they may be formed in the shape of a stripe along a vertical direction. Alternatively, the plurality of color filters 130 may be separated from each other along the horizontal direction, or overlapped at their edges.

The color filters 130 may be made using a known pigment dispersion method with a color photosensitive organic material.

The light blocking member 199 is provided on the plurality of color filters 130. The light blocking member 199 is black-colored and formed to block undesired light. An area where the undesired light is generated may be formed, for example, along a gate line 121 of the thin film transistor, or along a gate line and a data line 171 formed crossing the gate line 121.

The first column spacer CS1 and the second column spacer CS2 are provided at a predetermined distance from each other on the light blocking member 199.

The first column spacer CS1 and the second column spacer CS2 maintain a cell gap, which is a gap between the first substrate 110 and a second substrate 210.

The first column spacer CS1 is provided with a support portion CS1a and a column portion CS1b, and the second column spacer CS2 is provided with a column portion CS2.

In this case, a total height h1 of the first column spacer CS1 and a total height h2 of the second column spacer CS2 are equal to each other.

Compared to the second column spacer CS2, the support portion CS1a is provided below the column portion CS1b so as to support the column portion CS1b in the first column spacer CS1. In this case, the support portion CS1a has a greater horizontal cross-section than that of the column portion CS1b.

That is, the total height of the first column spacer CS1 and the total height of the second column spacer CS2 are equal to each other, and the first column spacer CS1 further includes the support portion CSa1 compared to the second column spacer CS2. Therefore, the height of the column portion CS1b included in the first column spacer CS1 is less than the height of the column portion of the second column spacer CS2.

In the first column spacer CS1, the support portion CS1a, having a greater horizontal cross-section, supports the column portion CS1b from below. Therefore, a cell gap recovery force of the first column spacer CS1 is greater than that of the second column spacer CS2, in which no support portion is provided.

Figure 4D:
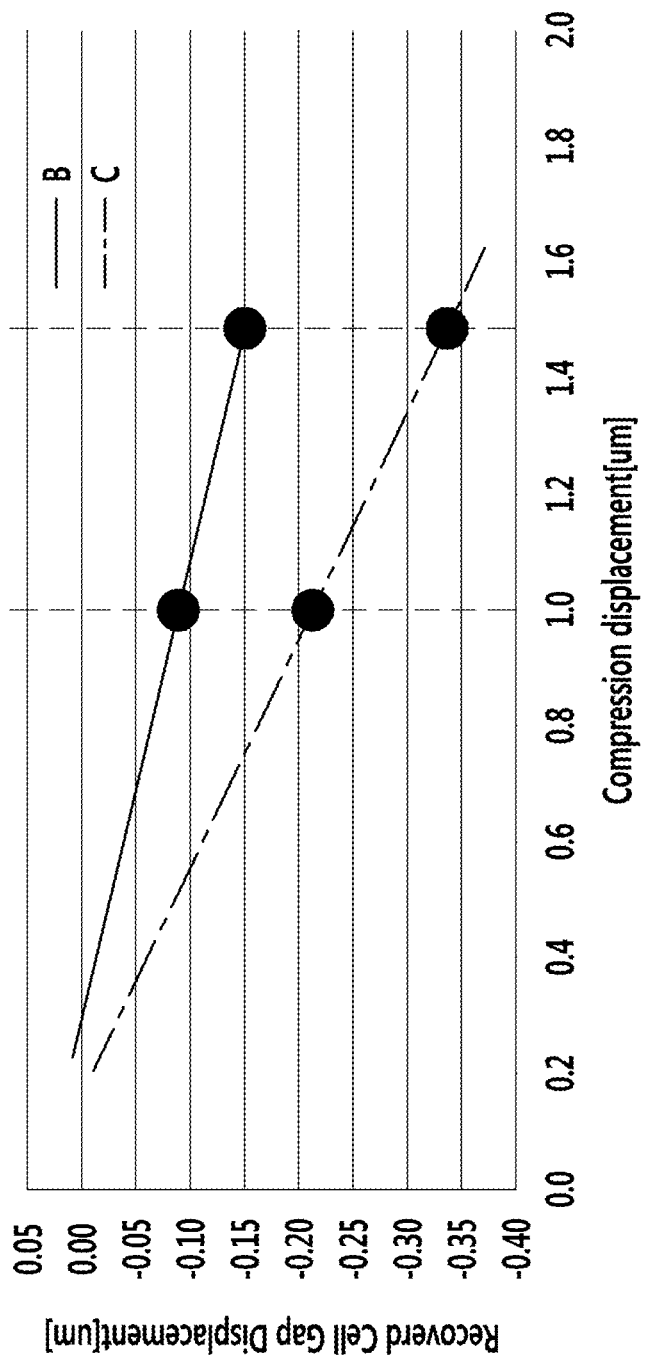
FIG. 4D shows a recovery force of a cell gap according to compression displacement.

FIGS. 4A, 4B, and 4C show a compression characteristic according to the different heights of the support portion of the column spacer, and FIG. 4D shows a cell gap recovery force according to compression displacement.

FIG. 4A shows a column spacer where the column portion CS2 is formed on the first substrate 110, and FIGS. 4B and 4C show column spacers respectively including the support portion CS1a and the column portion CS1b formed on the first substrate 110. FIGS. 4A, 4B, and 4C illustrate the same total height H, and a height a of the column portion CS1b of the column spacer in FIG. 4B is less than a height a of the column portion CS1b of the column spacer in FIG. 4C.

The compression characteristic of the cell gap is changed according to the height of the support portion CS1a.

It can be observed that the column spacers CS1 of FIG. 4B and FIG. 4C have smaller compression displacements, as compared to the compression displacement of the column spacer CS2 of FIG. 4A, and the column spacer of FIG. 4C has a smaller compression displacement than that of the column spacer of FIG. 4B.

That is, the column spacers CS1 provided with the support portions CS1a in FIGS. 4B and 4C have smaller compression displacements than that of the column spacer CS1 having no support portion CS1a in FIG. 4A, and the column spacer CS1 having a higher support portion CS1a in FIG. 4C has a smaller compression displacement than the column spacer CS1 having a lower support portion CS1a in FIG. 4B.

Referring to FIG. 4D, the solid line represents the column spacer of FIG. 4B and the one-point chain line represents the column spacer of FIG. 4C.

With reference to the same compression displacement of the cell gap, the height of a recovered cell gap displacement of the column spacer of FIG. 4B, of which the height of the support portion CS1a is less than that of the support portion CS1a of the column spacer of FIG. 4C, is less than that of the column spacer of FIG. 4C.

Each of the column spacers CS1 in FIGS. 4B and 4C provided with support portions CS1a has a lower compression displacement as compared to the column spacer CS2 in FIG. 4A that is not provided with the support portion CS1a, as a result of pressure and a greater recovery force.

The column spacer provided with the support portion CS1 is formed in an area where a high pressure is applied in the liquid crystal panel so that compression displacement resulting from pressure can be reduced and a recovery force of the cell gap can be improved, to thereby prevent occurrence of a smear phenomenon.

Figure 5:
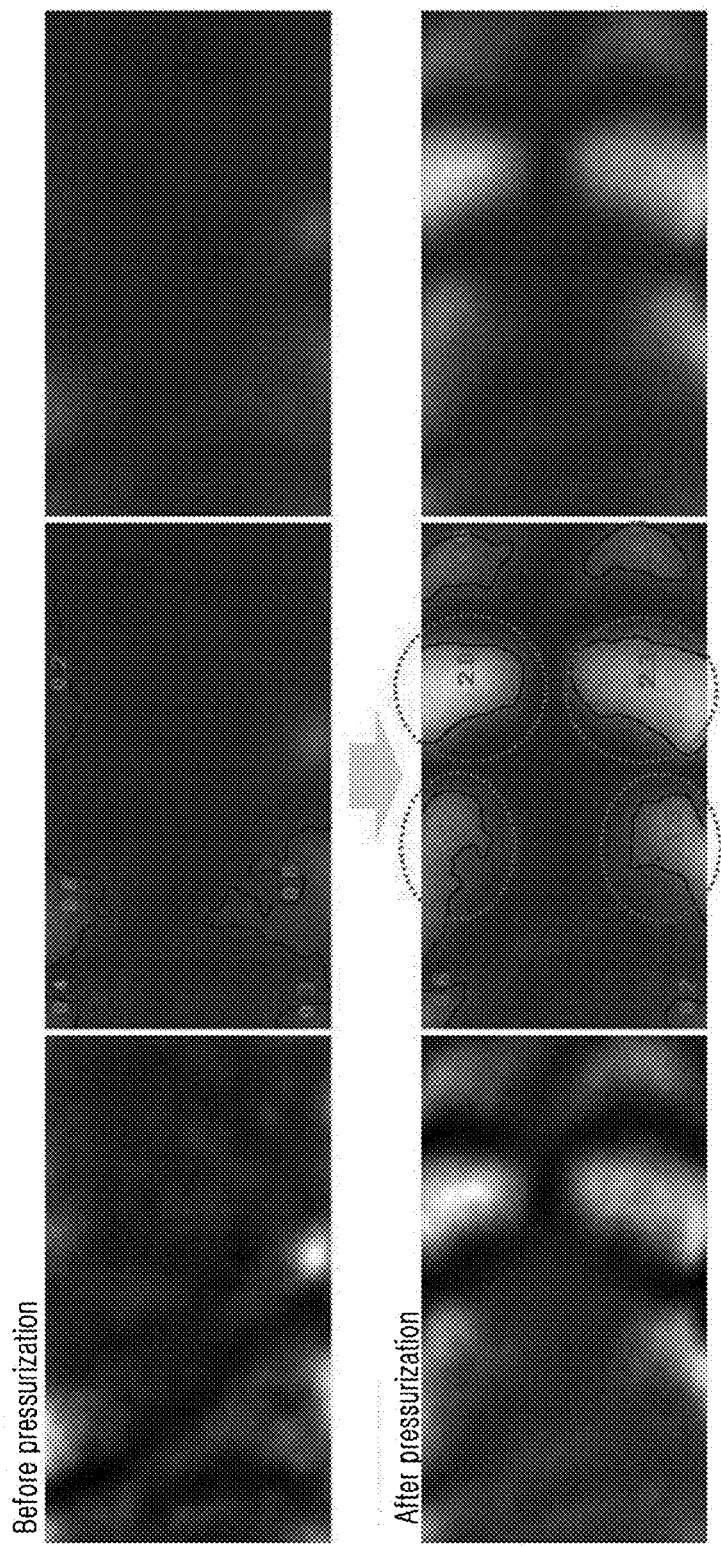
FIG. 5 shows a smear phenomenon due to an impact applied to a curved liquid panel.

FIG. 5 shows a smear phenomenon resulted from an impact applied to a curved liquid crystal panel.

Referring to FIG. 5, when a curved liquid crystal panel is formed, a pressure is applied to a center portion of the liquid crystal panel so that the center portion looks darker than a peripheral area, thereby causing the smear phenomenon.

The smear phenomenon occurs when a high pressure is continuously or instantaneously applied to the panel, and thus, a contact portion permanently looks darker than a peripheral area.

For a curved liquid crystal panel including a single column spacer, much more pressure is applied to a center portion than to a peripheral area of the liquid crystal panel so that a cell gap of the center portion is smaller than that of the peripheral area.

The cell gap is an important factor that affects luminance and transmittance of the liquid crystal 3, and indicates the height of the liquid crystal layer 300 filled between the first substrate 110 and the second substrate 210.

A center portion having a relatively smaller cell gap than a peripheral area has lower luminance compared to the peripheral area so that a smear failure occurs.

Again referring to FIG. 1 to FIG. 3, the first column spacer CS1 is formed in a center portion of the liquid crystal panel, and the second column spacer CS2 is formed in a peripheral area of the liquid crystal panel. In the drawing, one first column spacer CS1 and one second column spacer CS2 are respectively illustrated for convenience of description, but actually a plurality of the first column spacers CS1 are provided in the center portion of the liquid crystal panel, and a plurality of the second column spacers CS2 are provided in the peripheral area of the liquid crystal panel.

Because the curved liquid crystal panel is formed to be curved with reference to the center-line CL of the short-axial direction Y-Y', a center portion of the short-axial direction Y-Y' of the first substrate 110 has a larger cell gap according to a pressure than a peripheral area.

The first column spacer CS1 having the support portion CS1a is formed in the center portion where a high pressure is applied in the liquid crystal panel such that a compression displacement resulting from the pressure can be reduced and a recovery force of the cell gap can be improved, thereby preventing occurrence of the smear phenomenon.

In detail, the first column spacer CS1 having the support portion CS1a and the column portion CS1b may be formed in a central ⅓ area A arranged around the center-line CL in the short axial direction Y-Y' of the first substrate 110, and the second column spacer CS2 that does not have the support portion CS1a is formed in an area B other than the central ⅓ area A of the first substrate 110, so that the occurrence of the smear phenomenon in the center portion can be prevented.

In an exemplary embodiment of the present invention, the curved liquid crystal panel may be curved with reference to the short-axial direction Y-Y' of the first substrate 110. However, in other exemplary embodiments, for example, the curved liquid display panel may be curved with reference to a long-axial direction X-X' of the first substrate 110 such that the first column spacer CS1 provided with the support portion CS1a and the column portion CS1b may be formed in a center portion of the long-axial direction X-X' of the first substrate 110, and the second column spacer CS2 that does not include the support portion CS1a may be formed in a peripheral area.

The first column spacer CS1 and the second column spacer CS2 may be formed protruding while forming a shape that is substantially similar to a cylinder, a truncated circular cone, or a hemisphere from above the light blocking member 199, and the first column spacer CS1 and the second column spacer CS2 may be made of a material having elastic force, such as a thermosetting resin, such as an acryl.

In addition, the first column spacer CS1 and the second column spacer CS2 may be simultaneously formed using the same material through the same process with the light blocking member 199 and, because the first column spacer CS1, the second column spacer CS2, and the light blocking member 199 are made of an opaque polymer resin, they may function as a black matrix and a column spacer at the same time, thereby simplifying a manufacturing process.

Figure 6:
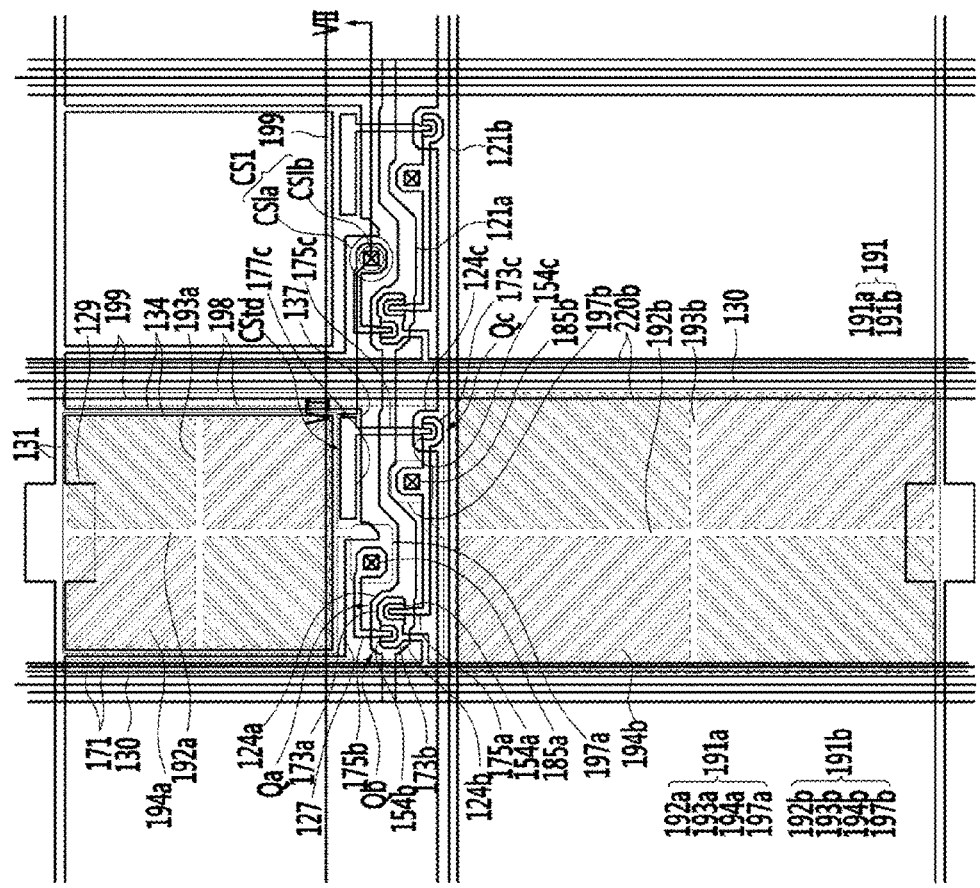
FIG. 6 is a top plan view of a pixel in a center portion of the liquid crystal panel of the liquid crystal display of FIG. 1.
Figure 7:
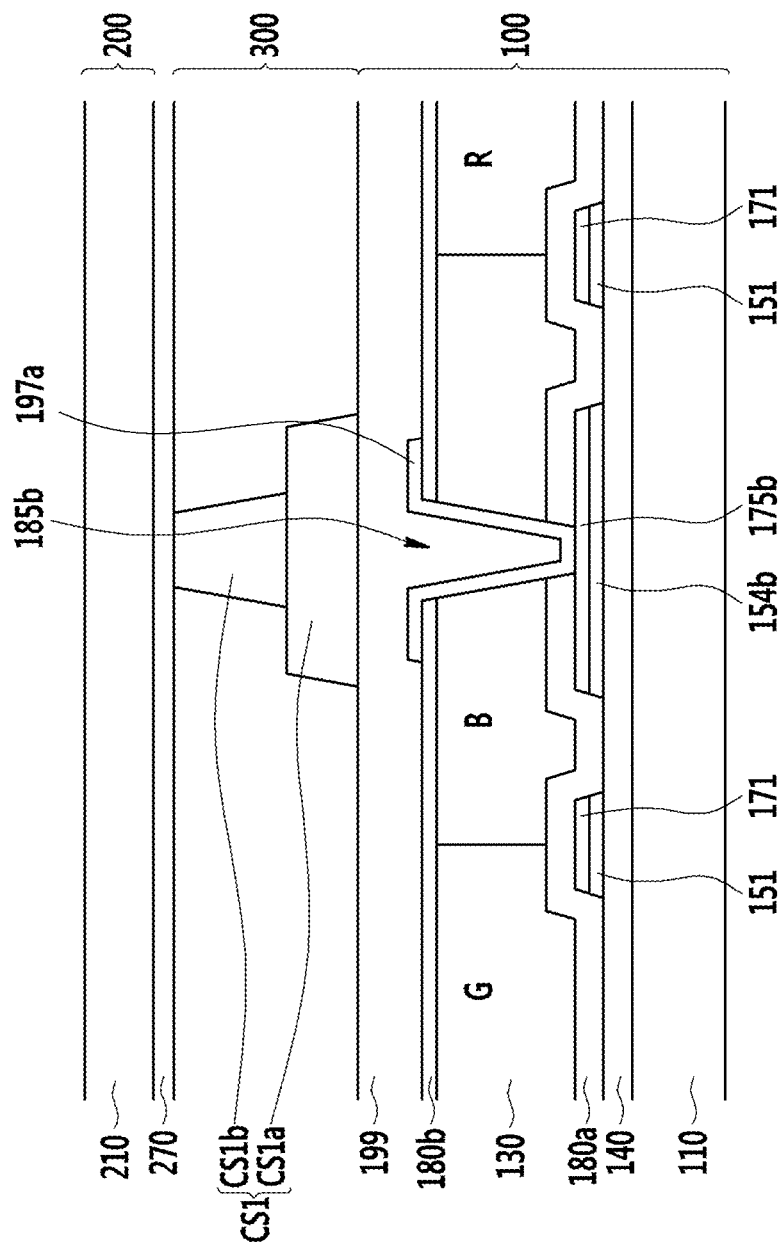
FIG. 7 is a cross-sectional view of FIG. 6, taken along the line VII-VII.

FIG. 6 is a top plan view illustrating one pixel in a center portion of a liquid crystal display realized according to the exemplary embodiment of FIG. 1, and FIG. 7 is a cross-sectional view of FIG. 6, taken along the line VII-VII.

Referring to FIG. 6 and FIG. 7, a liquid crystal display according to the present exemplary embodiment includes a lower display panel 100, an upper display panel 200, and a liquid crystal layer 300. The lower display panel 100 and the upper display panel 200 face each other, and the liquid crystal layer 300 is provided between the two display panels 100 and 200.

First, the lower display panel 100 will be described.

A plurality of gate conductors, including a plurality of gate lines that include a first gate line 121a and a second gate line 121b, and a plurality of storage electrode lines 131 are formed on a first substrate 110 including a pixel area.

The gate lines 121a and 121b substantially extend in a horizontal direction and transmit a gate signal. The first gate line 121a includes a first gate electrode 124a protruding upward and a second gate electrode 124b protruding downward, and the second gate line 121b includes a third gate electrode 124c protruding upward. The first gate electrode 124a and the second gate electrode 124b are connected with each other and form one protrusion.

The storage electrode lines 131 substantially extend in a horizontal direction and transmit a predetermine voltage such as a common voltage Vcom. The storage electrode line 131 includes a storage electrode 129 protruding upward and downward, a pair of vertical portions 134 substantially extending downward to be substantially perpendicular to the gate lines 121a and 121b, and a horizontal portion 127 connecting ends of the pair of vertical portions 134. The horizontal portion 127 includes a capacitor electrode 137 expanded downward.

A gate insulating layer 140 is formed on the gate conductors 121a, 121b, and 131.

A plurality of semiconductor stripes 151, which may be made of amorphous or crystalline silicon, are formed on the gate insulating layer 140. The semiconductor stripes 151 are mainly extended in a vertical direction, and include first and second semiconductors 154a and 154b extending toward the first and second gate electrodes 124a and 124b and connected with each other, and a third semiconductor 154c provided on the third gate electrode 124c.

A plurality of pairs of ohmic contacts (not illustrated) may be formed on the semiconductors 154a, 154b, and 154c. The ohmic contact may be made of a silicide or a material such as n+ hydrogenated amorphous silicon in which an n-type impurity is doped at a high concentration.

Data conductors, including a plurality of data lines 171, a plurality of first drain electrodes 175a, a plurality of second drain electrodes 175b, and a plurality of third drain electrodes 175c, are formed on the ohmic contacts.

The data lines 171 transfer data signals and mainly extend in a vertical direction to cross the gate lines 121a and 121b. Each data line 171 includes a first source electrode 173a and a second source electrode 173b which extend toward the first gate electrode 124a and the second gate electrode 124b and are connected to each other.

Each of the first drain electrode 175a, the second drain electrode 175b, and the third drain electrode 175c includes one wide end portion and the other rod-shaped end portion. The rod-shaped end portions of the first drain electrode 175*a* and the second drain electrode 175*b* are partially surrounded by the first source electrode 173*a* and the second source electrode 173*b*. One wide end portion of the first drain electrode 175*a* is again extended to form a third drain electrode 175*c*, which is curved in a U-shape. A wide end portion 177*c* of a third source electrode 173*c* overlaps with the capacitor electrode 137 to form a step-down capacitor Cstd, and the rod-shaped end portion is partially surrounded by the third drain electrode 175*c*.

The first gate electrode 124*a*, the first source electrode 173*a*, and the first drain electrode 175*a* form a first thin film transistor Qa together with the first semiconductor 154*a*, the second gate electrode 124*b*, the second source electrode 173*b*, and the second drain electrode 175*b* form a second thin film transistor Qb together with the second semiconductor 154*b*, and the third gate electrode 124*c*, the third source electrode 173*c*, and the third drain electrode 175*c* form the third thin film transistor Qc together with the third semiconductor 154*c*.

The semiconductor stripes, including the first semiconductor 154*a*, the second semiconductor 154*b*, and the third semiconductor 154*c*, may have substantially the same plane shape as the data conductors 171, 173*a*, 173*b*, 173*c*, 175*a*, 175*b*, and 175*c* and the ohmic contacts therebelow, except for channel regions between the source electrodes 173*a*, 173*b*, and 173*c* and the drain electrodes 175*a*, 175*b*, and 175*c*.

In the first semiconductor 154*a*, an exposed portion which is not covered by the first source electrode 173*a* and the first drain electrode 175*a*, is disposed between the first source electrode 173*a* and the first drain electrode 175*a*. In the second semiconductor 154*b*, an exposed portion, which is not covered by the second source electrode 173*b* and the second drain electrode 175*b*, is disposed between the second source electrode 173*b* and the second drain electrode 175*b*. In addition, in the third semiconductor 154*c*, an exposed portion, which is not covered by the third source electrode 173*c* and the third drain electrode 175*c*, is disposed between the third source electrode 173*c* and the third drain electrode 175*c*.

A first passivation layer 180*a* made of an inorganic insulator, such as a silicon nitride or a silicon oxide, is formed on the data conductors 171, 173*a*, 173*b*, 173*c*, 175*a*, 175*b*, and 175*c*, and the exposed portion of the semiconductors 154*a*, 154*b*, and 154*c*.

A plurality of color filters 130 are provided on the first passivation layer 180*a*. The plurality of color filters 130 include a red color filter, a green color filter, and a blue color filter that are arranged in parallel with each other. The red color filter, the green color filter, and the blue color filter may be arranged with the stripe shape in a vertical direction.

A second passivation layer 180*b* may be provided on the plurality of color filters 190. The second passivation layer 180*b* may be formed of an organic or inorganic layer, or it may be omitted altogether.

A pixel electrode 191, including a first sub-pixel electrode 191*a* and a second sub-pixel electrode 191*b*, is formed on the second passivation layer 180*b*. The first sub-pixel electrode 191*a* and the second sub-pixel electrode 191*b* are separated from each other, interposing the first gate line 121*a* and the second gate line 121*b* therebetween so as to be arranged above and below, thereby neighboring each other in a column direction. The height of the second sub-pixel electrode 191*b* may be approximately 1 to 3 times greater than the height of the first sub-pixel electrode 191*a*.

The overall shape of each of the first and second sub-pixel electrodes 191*a* and 191*b* is a quadrangle, and each of the first and second sub-pixel electrodes 191*a* and 191*b* includes cross stem portions formed of horizontal stem portions 193*a* and 193*b*, and vertical stem portions 192*a* and 192*b* crossing the horizontal stem portions 193*a* and 193*b*. In addition, the first sub-pixel electrode 191*a* and the second sub-pixel electrode 191*b* respectively include a plurality of minute branch portions 194*a* and 194*b*, lower protrusions 197*a*, and upper protrusions 197*b*.

The pixel electrode 191 is divided into four sub-areas by the horizontal stem portions 193*a* and 193*b* and the vertical stem portions 192*a* and 192*b*. The minute branch portions 194*a* and 194*b* obliquely extend from the horizontal stem portions 193*a* and 193*b* and the vertical stem portions 192*a* and 192*b*, and the extending direction may form an angle of approximately 45 degrees or 135 degrees with the gate line 121 or the horizontal stem portions 193*a* and 193*b*. Further, extending directions of the minute branch portions 194*a* and 194*a* of the two adjacent sub-areas may be perpendicular to each other.

In the present exemplary embodiment, the first sub-pixel electrode 191*a* further includes an outer stem portion surrounding the outside, and the second sub-pixel electrode 191*b* further includes horizontal portions positioned at an upper end and a lower end, and left and right vertical portions 198 positioned at the left and the right of the first sub-pixel electrode 191*a*. The left and right vertical portions 198 may prevent capacitive coupling, that is, coupling between the data line 171 and the first sub-pixel electrode 191*a*. The left and right vertical portions 198 may be omitted.

In the first passivation layer 180*a*, the color filters 130, the second passivation layer 180*b*, a plurality of first contact holes 185*a*, and a plurality of second contact holes 185*b*, which expose the wide end portion of the first drain electrode 175*a* and the wide end portion of the second drain electrode 175*b*, respectively, are formed. The first contact hole 185*a* may connect the second sub-pixel electrode 191*b* and the third drain electrode 175*c*, and the second contact hole 185*b* may connect the first sub-pixel electrode 191*a* and the second drain electrode 175*b*.

The light blocking member 199 is provided on the second passivation layer 180*b*, and the first column spacer CS1 is provided on the light blocking member 199.

The light blocking member 199 is provided along a direction in which the gate line 121 is extended so as to cover the color filter 130.

The first column spacer CS1 is formed protruding while forming a shape that is substantially similar to a cylinder, a truncated circular cone, or a hemisphere from above the light blocking member 199, and maintains a gap with the second substrate 210.

In this case, the light blocking member 199 and the first column spacer CS1 may be formed of the same material through the same process at the same time, or may be formed of different materials through different processes.

The first column spacer CS1 includes a column portion CS1*b* provided above a support portion CS1*a*, and a horizontal cross-section of the support portion CS1 is formed to be wider than a horizontal cross-section of the column portion CS1*b* so that a compression displacement resulting from a pressure can be reduced and a recovery force can be improved, thereby preventing occurrence of a smear phenomenon.

Next, the upper panel 200 will be described. A common electrode 270 is provided on the upper substrate 210. An upper alignment layer (not shown) may be formed on the common electrode 270. The common electrode 270 transmits a common voltage.

The liquid crystal layer 300 has negative dielectric anisotropy, and the liquid crystal molecules 3 of the liquid crystal layer 300 are aligned so that long axes thereof are perpendicular to the surfaces of the two panels 100 and 200 while the electric field is not applied. The liquid crystal layer 300 includes an alignment aid agent 50 including a reactive mesogen so that long axes of liquid crystal molecules may have pretilts so as to be substantially parallel with a length direction of the minute branch portions 194a and 194b of the pixel electrode 191. The alignment aid agent may be included in the alignment layer rather than in the liquid crystal layer.

The structure of the thin film transistor described with reference to FIG. 6 and FIG. 7 is an exemplary embodiment, and the membrane structure including the thin film transistor structure may be variously modified.

Hereinafter, a method for manufacturing the liquid crystal display according to the exemplary embodiment of the present invention will be described with reference to FIG. 8 and FIG. 9.

Figure 8:
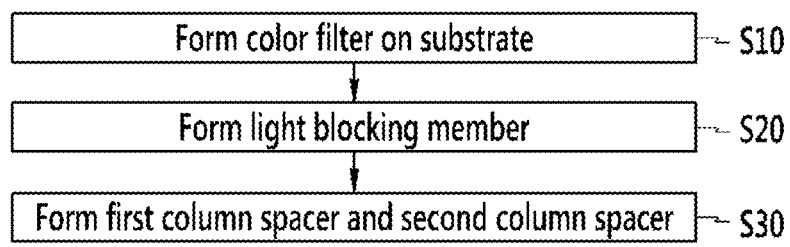
FIG. 8 is a flowchart of a manufacturing process of a liquid crystal display according to an exemplary embodiment of the present invention.

FIG. 8 is a flowchart illustrating a manufacturing process of the liquid crystal display according to the exemplary embodiment of the present invention, and FIG. 9 shows a method for manufacturing the light blocking member and the column spacers of the liquid crystal display according to the exemplary embodiment of the present invention.

Referring to FIG. 8, as previously described with reference to FIG. 6 and FIG. 7, the color filter 130 is formed on the first substrate 110 (S10).

First, the membrane structure 120 including the thin film transistor is formed on the first substrate 110, and the color filter 130 is formed on the membrane structure 120.

After the membrane structure 120 is formed, the color filter 130, including the red filter, the green filter, and the blue filter, is formed throughout the first substrate 110. In detail, a color (red, green, and blue) photoresistor having negative photosensitivity is coated first, and then the red filter, the green filter, and the blue filter are respectively formed through a photolithography process using a filter mask. Here, the formation order of the red filter, the green filter, and the blue filter may be changed.

Next, the light blocking member 199 is formed on the color filter 130 (S20).

The light blocking member 199 may be made of an opaque polymer resin.

Next, the first column spacer CS1 and the second column spacer CS2 are formed on the light blocking member 199 (S30).

The first column spacer CS1 and the second column spacer CS2 may be made of a material having an elastic force, such as a thermosetting resin like an acryl.

Referring to FIG. 9, a method for simultaneously manufacturing the light blocking member 199, the first column spacer CS1, and the second column spacer CS2 will be described.

In order to simultaneously manufacture the light blocking member 199, the first column spacer CS1, and the second column spacer CS2, a photoresist PR is coated to the first substrate 110, and then the first substrate 110 is exposed using a mask 1000 including a first area 1000a, a second area 1000b, a third area 1000c, and a fourth area 1000d.

In this case, the first area 1000a blocks all light generated from a light exposer (not shown), the second area 1000b forms a light blocking member by partially transmitting the light generated from the light exposer, the third area 1000c forms a column portion by wholly transmitting the light generated from the light exposer, and the fourth area 1000d forms a support portion by partially transmitting the light generated from the light exposer.

For example, the first area 1000a may block 100% of light, the second area 1000b may transmit 20% of the light, the third area 1000c may transmit 100% of the light, and the fourth area 1000d may transmit 30% of the light.

That is, the exposure is performed using the negative photoresist so that a photoresist of the first area 1000a may be removed, the second area 1000b may form a light blocking member 191 by transmitting 20% of the light, the third area 1000c may form column portions CS1b and CS2 by transmitting 100% of the light, and the fourth area 1000d may form a support portion CS1a by transmitting 30% of the light.

Next, in a curing step, a first column spacer CS1 provided with the support portions CS1a and the column portion CS1b and a second column spacer CS2 provided with the column portion CS2 may be formed by patterning through irradiation of ultraviolet rays and the like.

The first column spacer CS1 and the second column spacer CS2 of the present exemplary embodiment are made of an opaque polymer resin, and therefore they may function of a black matrix, and the black matrix and the column spacers are simultaneously formed through one mask process so that the manufacturing process can be simplified.

The lower panel 100 and the upper panel 200 are bonded to each other using a sealant (not shown), and the liquid crystal layer may be formed by injecting liquid crystals in a space between the two panels 100 and 200 using a vacuum injection method or the liquid crystal layer may be formed through a liquid crystal dripping method.

According to the present invention, the first column spacer including the support portion and the column portion is formed in a middle third of the first substrate around a center-line in the short-axial direction of the first substrate, and the second column spacer that does not include a support portion is formed at an area other than the middle third of the first substrate so that occurrence of a smear phenomenon at a center portion can be prevented.

According to the present invention, the first column spacer, the second column spacer, and the light blocking member can be simultaneously formed through the same process, and the first column spacer, the second column spacer, and the light blocking member are formed of an opaque polymer resin so that they can perform functions as a black matrix and the column spacers at the same time, thereby simplifying a manufacturing process.

It will be apparent to those skilled in the art that various modifications and variations can be made in the present invention without departing from the spirit and scope of the invention. Thus, it is intended that the present invention cover the modifications and variations of this invention provided they come within the scope of the appended claims and their equivalents.

What is claimed is:

1. A liquid crystal display comprising:
a light blocking member disposed on a substrate; and
a first column spacer and a second column spacer formed at a predetermined distance from each other on the light blocking member,
wherein:
the first column spacer comprises a support portion and a column portion, and the second column spacer comprises a column portion; and the support portion comprises a flat upper surface surrounding a lower edge of the column portion and has a wider horizontal cross-section than the column portion and comprises a flat upper portion.

2. The liquid crystal display of claim 1, wherein a total height of the first column spacer and a total height of the second column spacer are equal to each other.

3. The liquid crystal display of claim 1, wherein the support portion is disposed below the column portion and configured to support the column portion.

4. The liquid crystal display of claim 1, further comprising a thin film transistor disposed on the substrate, wherein the light blocking member extends along a gate line of the thin film transistor.

5. The liquid crystal display of claim 1, wherein the light blocking member and the first column spacer are made of the same material, and the light blocking member and the second column spacer are made of the same material.

6. The liquid crystal display of claim 1, wherein the first column spacer is disposed in a middle third of the substrate measured around a center-line in a short-axial direction of the substrate.

7. The liquid crystal display of claim 1, wherein the second column spacer is disposed in an area other than a middle third of the substrate measured around a center-line in a short-axial direction of the substrate.

8. The liquid crystal display of claim 1, further comprising a plurality of color filters disposed on the substrate.

9. The liquid crystal display of claim 8, wherein the light blocking member is disposed on the color filters.

* * * * *